United States Patent
Weimer et al.

(10) Patent No.: US 9,090,971 B2
(45) Date of Patent: Jul. 28, 2015

(54) ULTRA-THIN METAL OXIDE AND CARBON-METAL OXIDE FILMS PREPARED BY ATOMIC LAYER DEPOSITION (ALD)

(75) Inventors: Alan W. Weimer, Niwot, CO (US); Xinhua Liang, Rolla, MO (US); Jianhua Li, Superior, CO (US); John L. Falconer, Boulder, CO (US); Miao Yu, Pittsford, NY (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 0 days.

(21) Appl. No.: 13/319,122

(22) PCT Filed: May 11, 2010

(86) PCT No.: PCT/US2010/034365
§ 371 (c)(1),
(2), (4) Date: Apr. 26, 2012

(87) PCT Pub. No.: WO2010/135107
PCT Pub. Date: Nov. 25, 2010

(65) Prior Publication Data
US 2012/0201860 A1 Aug. 9, 2012

Related U.S. Application Data

(60) Provisional application No. 61/177,184, filed on May 11, 2009.

(51) Int. Cl.
| | |
|---|---|
| *C23C 16/00* | (2006.01) |
| *C23C 16/06* | (2006.01) |
| *C23C 16/18* | (2006.01) |
| *C23C 16/40* | (2006.01) |
| *B01D 67/00* | (2006.01) |
| *B01D 71/02* | (2006.01) |
| *C23C 16/30* | (2006.01) |
| *C23C 16/44* | (2006.01) |
| *C23C 16/442* | (2006.01) |
| *C23C 16/455* | (2006.01) |
| *H01M 8/10* | (2006.01) |

(52) U.S. Cl.
CPC .......... *C23C 16/403* (2013.01); *B01D 67/0002* (2013.01); *B01D 67/0072* (2013.01); *B01D 67/0079* (2013.01); *B01D 71/022* (2013.01); *B01D 71/024* (2013.01); *B01D 71/025* (2013.01); *C23C 16/30* (2013.01); *C23C 16/442* (2013.01); *C23C 16/4417* (2013.01); *C23C 16/45525* (2013.01); *C23C 16/45555* (2013.01); *B01D 2325/04* (2013.01); *B01D 2325/10* (2013.01); *H01M 8/1016* (2013.01)

(58) Field of Classification Search
CPC .................................................. C23C 16/45525
USPC .............. 427/255.28, 255.36, 255.395, 419.1
See application file for complete search history.

(56) References Cited

U.S. PATENT DOCUMENTS

| | | | |
|---|---|---|---|
| 6,664,186 B1 * | 12/2003 | Callegari et al. | 438/681 |
| 7,166,531 B1 * | 1/2007 | van den Hoek et al. | 438/623 |
| 7,241,704 B1 * | 7/2007 | Wu et al. | 438/781 |
| 2002/0156180 A1 * | 10/2002 | Yamada et al. | 524/588 |
| 2003/0157248 A1 * | 8/2003 | Watkins et al. | 427/256 |
| 2004/0121073 A1 | 6/2004 | George | |
| 2007/0256978 A1 * | 11/2007 | Stucky et al. | 210/660 |
| 2009/0081883 A1 * | 3/2009 | Freeman et al. | 438/765 |
| 2010/0135937 A1 | 6/2010 | O'Brien | |

FOREIGN PATENT DOCUMENTS

| | | |
|---|---|---|
| WO | 2008/069894 A | 6/2008 |
| WO | 2008/118422 A | 10/2008 |

OTHER PUBLICATIONS

Seghete et al. Synthesis and characterization of hybrid organic-inorganic thin films via atomic layer deposition for MEMES/NEMS. Sep. 30, 2008. http://www.colorado.edu/MCEN/micronanobio/Supplementary/HH08%20Paper%20-%20Dragos%20ver4.pdf.*

Chen et al., "New nonhydrolytic route to synthesize crystalline BaTiO3 nanocrystals with surface capping ligands", J. Mater. Sci., vol. 21, pp. 3187-3195 (2006).

Huang et al., Barium titanate nanocrystals and nanocrystal thin films: Synthesis, ferroelectricity, and dielectric properties, J. Applied Physics 100, 034216 (2006).

* cited by examiner

*Primary Examiner* — Frederick Krass
*Assistant Examiner* — Tracy Liu
(74) *Attorney, Agent, or Firm* — Gary C Cohn PLLC

(57) ABSTRACT

Ultra-thin porous films are deposited on a substrate in a process that includes laying down an organic polymer, inorganic material or inorganic-organic material via an atomic layer deposition or molecular layer deposition technique, and then treating the resulting film to introduce pores. The films are characterized in having extremely small thicknesses of pores that are typically well less than 50 nm in size.

8 Claims, 2 Drawing Sheets

ULTRA-THIN METAL OXIDE AND CARBON-METAL OXIDE FILMS PREPARED BY ATOMIC LAYER DEPOSITION (ALD)

This application claims priority from U.S. Provisional Patent Application No. 61/177,184, filed 11 May 2009.

STATEMENT OF GOVERNMENT INTEREST

This invention was made with government support under grant no. CMMI0400292 awarded by the National Science Foundation. The government has certain rights in the invention.

The work disclosed herein was partly supported by the United States National Science Foundation under grant no. 0400292.

Materials with an interconnected porous structure are being studied widely for applications in optical and catalytic materials, separation, drug delivery, reactors for large molecules reactions, and so on. Ultra-thin porous film coatings are potentially important for a number of different applications. For example, nanoparticle catalyst materials have the potential for high impact in applications such as chemical manufacturing, pollution control, green chemistry, liquid fuel production, and power generation. A porous, ultra-thin microporous/mesoporous coating on the surface of a nanoparticle catalyst can permit certain reactants to approach catalytic sites on the catalyst particle while preventing other, larger molecules from reaching the catalytic sites. Selective catalytic activity potentially can be imparted in such a manner.

Another potential application for porous ultra-thin films is in Micro-Electro-Mechanical Systems (MEMS), in which mechanical elements, sensors, actuators, and electronics are integrated onto a common silicon substrate through microfabrication technology. For example, functionalization of metal-insulator-semiconductor (MIS) sensors enables them to selectively detect many analytes. A common approach for enhancing the selectivity of MIS sensors and other metal-oxide-semiconductor capacitor or transistor-like devices is the application of surface coatings to improve the detection of analytes of interest. Coating ultra-thin microporous films on sensor surface can permit certain analytes of interest to approach the sensor surface through molecular size-discrimination and thus enhance the selectivity of these sensors.

Porous ultra-thin films also have potential applications in high flux/selectivity membranes, which may be useful in many applications including water desalination, gas separation, and selective proton/oxygen conduction in fuel cells. If the pore size of the films can be controlled properly, it may be possible to provide for very high flux and high selectivity membranes. However, the requirement of controlling both the thickness of extremely thin (nanometer thick) inorganic films having precisely controlled pore sizes is impossible to achieve by conventional methods. Conventional thin film deposition techniques cannot provide such control.

Porous membranes can be formed by oxidizing or reducing (i.e. carbonization) certain organic template films. Many techniques such as chemical vapor deposition (CVD) have been developed for fabricating thin polymeric films, which in some case may be made porous by subsequent treatments such as oxidation or reduction reactions. However, CVD methods cannot closely control the thickness of the films (especially at very small film thicknesses), nor can they form a highly ordered film structure. This in turn limits the ability to produce a porous film having the desired functionality.

Atomic layer deposition (ALD) and molecular layer deposition (MLD) methods have been employed to grow inorganic, organic polymer and hybrid inorganic-organic films. These methods allow extremely precise control over the coating thickness, and have the further advantage of forming very ordered structures. ALD and MLD processes heretofore have focused on the formation of dense (i.e., non-porous) films on solid substrates.

It would be desirable to provide a process whereby an ultra-thin, porous film can be provided on a substrate. It would be further desirable if the process would provide control over the porosity, pore size, or both porosity and pore size.

In one aspect, this invention is a process for producing a porous film on a substrate. The process comprises (a) applying a 0.5 to 50 nm-thick film of an organic polymer, an organic material or an inorganic-organic hybrid material to at least a portion of the surface of a substrate via an atomic layer deposition process and (b) subjecting the organic polymer, inorganic material or inorganic-organic hybrid film to conditions such that pores form in the film. The pores may form via a variety of possible mechanisms, including chemical processes such as oxidization, reduction, hydrolysis, pyrolysis, decomposition or some other chemical reaction or mechanism.

The porous film preferably has a thickness of at least 1 nm, more preferably at least 2 nm. The porous film preferably has a thickness of up to 30 nm, and even more preferably up to 20 nm. Film thicknesses are measured using transmission electron microscopy (TEM) methods or other methods having a resolution of less than 10 nanometers. The film preferably has a surface area of at least 10 $m^2$/g, more preferably at least 25 $m^2$/g, even more preferably at least 50 $m^2$/g, still more preferably at least 100 $m^2$/g. The surface area of the film may be 140 $m^2$/g or more. Surface areas for purposes of this invention are measured using the Brunauer-Emmett-Teller (BET) method.

The porous film has pores having widths that are mainly in the size range of from about 2 to 5000 angstroms, preferably from about 2 to about 250 angstroms. It is most preferred that the width of the pores are mainly from 2 to 100 angstroms. Pore widths for purposes of this invention are calculated by the Horvath-Kawazoe (HK) model for widths of less than about 50 angstroms, or by the Barrett-Joyner-Halenda (BJH) model for widths from 20 to 5000 angstroms. The film preferably is essentially free of pores having widths greater than 5000 angstroms. In some embodiments, the porous film is essentially free of pores having widths greater than 1000 angstroms, or greater than 500 angstroms, or greater than 100 angstroms. In certain embodiments, the porous film contains pores having a width of from 2 to 100 angstroms (micropores) and larger pores (mesopores) having a width of greater than 100 angstroms to about 5000 angstroms, preferably greater than 100 angstroms to 1000 angstroms.

In another aspect, this invention is a substrate having coated on at least a portion of its surface a porous film having a thickness of from 0.5 to 50 nm, wherein the film has a BET surface area of at least 100 $m^2$/g and contains pores having a pore width of from 2 to 5000 angstroms. The substrate may be any of a wide range of materials that are solids at temperatures of at least 100° C. or such higher temperature at which the ALD or MLD process by which the film is formed is conducted. The substrate can be or contain, for example, a catalytic material; a reagent for a chemical reaction; a porous material which may function as a support for a membrane or filtration device; a pharmaceutical or nutrient; or a MEMS device or sensor; or any of a wide range of other materials.

Figure 1:
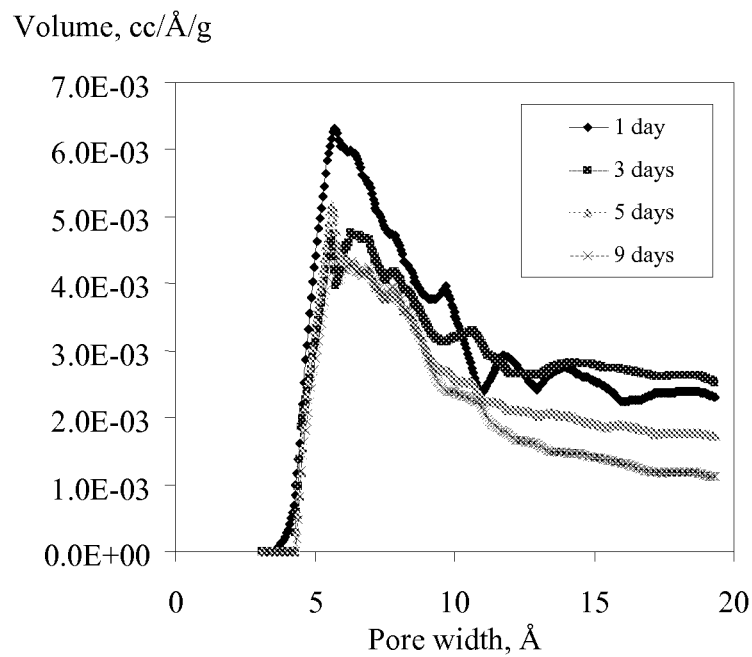
FIG. 1 is a graph indicating the distribution of micropores on a water-treated alucone film produced according to Example 1, as a function of treatment time.

The film is an inorganic material, an organic polymer or an inorganic-organic hybrid material that meets two main criteria. The first is that the film is one that is capable of being deposited on the substrate via an ALD process. The second is that pores can be formed in the film in a controlled manner through some chemical and/or thermal process. Such a process can be, for example, oxidization, reduction, hydrolysis, pyrolysis, decomposition or some other chemical reaction or mechanism.

ALD is a method by which ultrathin layers of inorganic materials, organic polymers or inorganic-organic hybrid materials can be deposited onto a variety of substrates. The layers are produced by sequentially conducting a series of half-reactions at the surface of a substrate. Each set of half-reactions deposits a layer that is about 1 to 50 angstroms thick and which conforms to the surface of the underlying substrate. By repeating the reaction sequence, a layer of any desired thickness can be deposited onto the substrate surface. ALD processes are sometimes referred to as molecular layer deposition (MLD) processes when used to deposit an organic polymer. This application uses the terms interchangeably, and the general processing steps are the same in both ALD and MLD.

ALD processes for depositing inorganic films are described generally in a variety of references, including George et al., *J. Physical Chem.* 1996, 100, 13121; Ritala et al., "Atomic Layer Deposition" in *Handbook of Thin Film Materials*, H. S. Halwa, Ed., 2001, Academic Press, San Diego, Calif.; Dillon et al., *Thin Solid Films* 1997, 292, 135; U.S. Pat. No. 6,613,383 and U.S. Pat. No. 6,218,250.

MLD processes for depositing organic polymer films are described, for example, in Yoshimura et al., *Applied Physics Letters,* 1991, 59, 482; Shao et al., *Polymer* 1997, 38, 459; and Kim et al., *JACS,* 2005, 127, 6123. These MLD processes employ a binary reaction scheme, in which a bifunctional first reactant that takes the form A-X-A is reacted with a bifunctional second reactant, which takes the form B-Y-B. The A-X-A material contains two identical reactive groups (designated as A) linked by a linking group X. The B-Y-B material contains two identical reactive groups (B) linked by a linking group Y. WO 08/069,894 describes an alternative ALD process for making organic polymer films or inorganic-organic hybrids, in which the reactants react only monofunctionally with the growing organic polymer. All of these processes may be suitable for producing films in accordance with this invention.

The ALD process is characterized by several features. All reagents are applied in the vapor phase. When multiple reactants are used, the reagents are applied to the substrate sequentially, i.e., one after the other, rather than simultaneously. Excess reagent, if any, is removed from the reaction zone prior to introduction of the next reagent. This is typically done by drawing a high vacuum in the reaction zone after each reactant is dosed into the reactor, and/or by purging the reaction zone with an inert purge gas after each dose of reactant. As a result of this removal step, each reactant is deposited almost exclusively as a mono-molecular layer at the surface of the substrate. Removal of excess reagent in this manner prevents reactions from occurring at places other than the surface of the substrate, such as in the vapor phase. Vapor phase reactions are undesirable, as they tend to form polymer particles or droplets that can condense and deposit on the substrate (and reactor surfaces). This condensation can lead to non-uniformity in the thickness of the deposited polymer as well as other problems, and is to be avoided. Sequential addition of the reagents, together with removal of excess reagent prior to introducing the next reagent into the reaction zone, can minimize or prevent the undesired vapor phase reactions.

All reaction by-products produced in the ALD process are gasses or have a vapor pressure of at least 1 milliTorr, preferably at least 100 milliTorr and even more preferably at least 1 Torr, at the temperature at which the process is conducted. This facilitates removal of the by-products from the reaction zone and minimizes or prevents the by-products from condensing on the substrate or reactor surfaces. Reaction by-products are removed from the reaction zone prior to the introduction of the next reactant, in the same manner as described above.

The temperature at which the ALD or MLD process is conducted depends on the particular reactants and the substrate. The temperature is high enough that the reagents exhibit a vapor pressure of at least 1 milliTorr, more preferably at least 100 milliTorr and even more preferably at least 1 Torr. The temperature is also high enough that the reactants will react with surface species on the substrate. The temperature must not be so high that the coating or substrate thermally degrades. The temperature must be low enough that the substrate does not become distorted in the process. A suitable temperature range can be from 273 K to 1000 K, depending on the particular coating and the particular substrate. A preferred temperature range is from 273 K to 500 K and an even more preferred temperature range is from 300 K to 450 K.

The vapor phase reactants used herein are gasses or else have a vapor pressure of at least 1 milliTorr at the temperature at which the reaction is conducted. The vapor phase reactants preferably have a vapor pressure of at least 100 milliTorr and more preferably at least 1 Torr at such temperature.

A second characteristic of the ALD process is that the vapor phase reactants can react with a functional group on the surface of the substrate or on the growing molecules of the deposited film to form a bond to the substrate or the film molecules, as the case may be. A third characteristic is that upon reacting with the substrate or with the growing film molecules, the vapor phase reactants each produce either (1) a functional group (which may be in some cases blocked, masked or otherwise protected) with which the other vapor phase reactant can react or (2) a precursor to such a functional group.

The substrate can be any material which is thermally and chemically stable at the temperature at which the ALD or MLD process is performed. It can be organic or inorganic; and have any suitable shape and size, consistent with the capacity of the apparatus used to apply the ALD or MLD coating. Examples of suitable substrates include ceramic materials of various types, organic polymer, silicon wafers, MEMS devices (in particular MIS devices), synthetic bone or other implantable synthetic tissues, supported catalysts and the like.

In some embodiments, the substrate is a particle having a number average particle size of no greater than 500 microns, more preferably no greater than 100 microns, still more preferably no greater than 1 micron and even more preferably no greater than 100 nanometers. When the film is to be applied to particles, it can be carried out in a fluidized bed reactor (FBR), which can be used to efficiently deliver gas phase reactive precursors to bulk quantities of particles. This type of unit operation is commonly used in various manufacturing processes for making powders that can be used as substrates in this invention. For example, pharmaceutical particles can be manufactured in a fine powder form and dried in an FBR. The ALD process may in some cases be integrated into such a unit operation into an existing unit operation.

The number of ALD/MLD cycles is continued until a film of the desired thickness has been deposited. The film thickness is in most cases proportional to the number of ALD cycles that are performed, although some deviations may be seen during the first few reaction cycles. The ALD process also forms highly ordered film structures due to the sequential and alternating addition of reactants followed by removal of excess reactants and reaction products before the addition of the next reactant in the sequence. From 5 to 1000 or more ALD/MLD cycles can be performed to produce the film. It is often unnecessary to perform more than 40 cycles or more than 20 cycles. The film thickness, prior to pore formation, may be from 2 to 500 angstroms in some embodiments and from 2 to 30 or from 2 to 20 angstroms in more preferred embodiments.

ALD Process for Producing Organic Polymer Films.

The film is in some embodiments an organic polymer. The organic polymer may be a homopolymer (i.e., a polymer of the form -(A)$_a$-), or a copolymer having, for example, any of the forms -(A-B)$_a$-, -(A-B-C)$_a$-, -(A-B-C-D)$_a$-(A-B)$_x$-(E-B)$_y$-, -(A)$_a$-(B)$_b$-, or -(A-B)$_x$-(C-D)$_y$-, wherein A, B, C, D and E represent different repeating units, x and y are positive numbers, a and b are each at least 2.

At least one of the vapor phase reactants in such cases is an organic material which contributes carbon atoms to the composition of the film. At least some of those carbon atoms form a divalent or polyvalent repeating unit in the organic polymer.

The vapor phase reactants may contain two functional groups which have approximately equal reactivity in the ALD process. The Yoshimura et al., *Applied Physics Letters*, 1991, 59, 482; Shao et al., *Polymer* 1997, 38, 459; and Kim et al., *JACS*, 2005, 127, 6123 references mentioned before describe vapor phase reactants of this type. The ALD process in this case employs a binary reaction scheme, in which a bifunctional first reactant that takes the form A-X-A is reacted with a bifunctional second reactant, which takes the form B-Y-B. The A-X-A material contains two identical reactive groups (designated as A) linked by a linking group X. The B-Y-B material contains two identical reactive groups (B) linked by a linking group Y.

In other embodiments, however, the vapor phase reactants react only monofunctionally with the substrate or growing polymer or inorganic-organic hybrid chain, i.e., only one group or moiety on the vapor phase reactant is capable of reacting with the substrate or growing polymer chain under the conditions of the reaction. This prevents unwanted cross-linking or chain termination that can occur when a vapor phase reactant can react polyfunctionally. A reactant is considered to react "monofunctionally" if during the reaction the reactant forms a bond to only one polymer chain, and does not self-polymerize under the reaction conditions employed. However, it is possible in certain embodiments of the invention to use a vapor phase reactant that can react bifunctionally with the substrate or growing polymer chain. In other cases, a vapor phase reactant may react bifunctionally with the substrate or growing polymer chain, and in addition contains at least one additional functional group.

A first class of monofunctional vapor phase reactants includes compounds having two different reactive groups, one of which is reactive with a functional group on the substrate or polymer chain and one of which does not readily react with a functional group on the polymer chain but is reactive with a functional group supplied by a different vapor phase reactant. Examples of reactants of this class include:

a) Hydroxyl compounds having vinyl or allylic unsaturation. These can react with a carboxylic acid, carboxylic acid halide, or siloxane group to form an ester or silicone-oxygen bond and introduce vinyl or allylic unsaturation onto the polymer chain. Alternatively, the unsaturated group can react with a primary amino group in a Michaels reaction to extend the polymer chain and introduce a hydroxyl group onto the chain.

b) Aminoalcohol compounds. The amino group can react with a carboxyl group, a carboxylic acid chloride, a vinyl or allylic group, or an isocyanate group, for example, to extend the polymer chain and introduce a hydroxyl group onto the chain. Alternatively, the hydroxyl group can react with a siloxane species to form a silicon-oxygen bond and introduce a free primary or secondary amino group.

A second class of suitable monofunctional vapor phase reactants includes various cyclic compounds which can engage in ring-opening reactions. The ring-opening reaction produces a new functional group which does not readily react with the cyclic compound. Examples of such cyclic compounds include, for example:

a) Cyclic azasilanes. These can react with a hydroxyl group to form a silicon-oxygen bond and generate a free primary or secondary amino group.

b) Cyclic carbonates, lactones and lactams. The carbonates can react with a primary or secondary amino group to form a urethane linkage and generate a free hydroxyl group. The lactones and lactams can react with a primary or secondary amino group to form an amide linkage and generate a free hydroxyl or amino group, respectively.

A third class of monofunctional vapor phase reactants includes compounds that contain two different reactive groups, both of which are reactive with a functional group on the polymer chain, but one of which is much more highly reactive with that functional group. This allows the more reactive of the groups to react with the functional group on the polymer chain while leaving the less reactive group unreacted and available for reaction with another vapor phase reactant.

A fourth class of monofunctional vapor phase reactants includes compounds that contain two reactive groups, one of which is blocked or otherwise masked or protected such that it is not available for reaction until the blocking, masking or protective group is removed. The blocking or protective group can be removed chemically in some cases, and in other cases by thermally decomposing the blocking group to generate the underlying reactive group, by radiating the group with visible or ultraviolet light, or in a photochemical reaction. The unprotected group may be, for example, an amino group, anhydride group, hydroxyl group, carboxylic acid group, carboxylic anhydride group, carboxylic acid ester group, isocyanate group and the like. The protected group may be one which, after removal of the protective group, gives rise to a functional group of any of the types just mentioned.

A reactant of this fourth class may, for example, have a hydroxyl group protected by a leaving group such as a benzyl, nitrobenzyl, tetrahydropyranyl, —$CH_2OCH_3$ or similar group. In these cases, the hydroxyl group can be deprotected in various ways, for example by treatment with HCl, ethanol, or in some cases, heat or irradiation. Carboxyl groups can be protected with leaving groups such as —CH$_2$SCH$_3$, t-butyl, benzyl, dimethylamino and similar groups. These groups can be deprotected by treatment with species such as trifluoroacetic acid, formic acid, methanol or water to generate the carboxylic acid group. Amino groups can be protected with groups such as R—OOC—, wherein R is an organic group, which can be removed by reaction with trifluoroacetic acid, hydrazine or ammonia. Isocyanate groups can be protected with carboxyl compounds such as formic acid or acetic acid.

A fifth class of monofunctional vapor phase reactants contains a first functional group and a precursor group at which a further reaction can be conducted to produce a second functional group. In such a case, the first functional group reacts to bond to the polymer chain, and chemistry is then performed at the precursor group to generate a second functional group. The first functional group can be any of the types mentioned before, including a siloxane group, amino group, anhydride group, hydroxyl group, carboxylic acid group, carboxylic anhydride group, carboxylic acid ester group, isocyanate group and the like. A wide variety of precursor groups can be present on this type of reactant.

The precursor group is one that it does not itself react with the polymer chain, but it can be converted to a functional group that can react with another vapor phase reactant to grow the chain. Two notable types of precursor groups are vinyl and/or allylic unsaturation, and halogen substitution, especially chlorine or bromine. Vinyl and allylic unsaturation can be converted to functional groups using a variety of chemistries. These can react with ozone or peroxides to form carboxylic acids or aldehydes. They can also react with ammonia or primary amino to produce an amine or imine. Halogens can be displaced with various functional groups. They can react with ammonia or primary amine to introduce an amino group, which can in turn be reacted with phosgene to produce an isocyanate group, if desired.

Reactants that are used to convert a precursor group to a functional group or to demask or deprotect a functional group are introduced in the vapor phase, and should have vapor pressures as described above with respect to other reactants. The reaction products formed when such other reagents react in the MLD process also should have vapor pressures as just indicated. As before, excess reactants of this type are removed prior to the introduction of the next reactant, typically by drawing a high vacuum in the reaction zone, purging the chamber with a purge gas, or both. Reaction by-products are removed in the same manner, before introducing the next reactant into the reaction zone.

The foregoing are illustrative only, as a large number of other vapor phase reactants can be used in similar manner.

Homopolymers can be prepared using a vapor phase reactant of the fourth or fifth class of monofunctional vapor phase reactants described above. Reactants of that type will react with a functional group at the substrate surface or on the growing polymer chain to form a bond and extend the polymer chain. A precursor to a functional group, or a masked or protected functional group is simultaneously introduced onto the polymer chain. A subsequent reaction forms a new functional group on the polymer chain, which can react with another dose of the vapor phase reactant to further extend the chain. This process can be illustrated by the following reaction scheme:

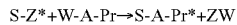    IA)

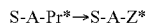    IB)

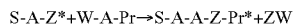    IC)

wherein steps IB and IC are then repeated until the desired polymer molecular weight has been attained. In reactions IA-IC, S represents the substrate surface, Z and W each represents a leaving group, Pr represents a precursor to a functional group or a masked or blocked functional group which, after conversion or demasking or deblocking, forms a functional group that contains a leaving group Z, and * represents a reactive site. In step IA, the W group but not the Pr group of the W-A-Pr molecule reacts at the substrate surface to displace the Z moiety and form a bond thereto. ZW is formed as a reaction by-product, and is removed before conducting subsequent steps. In step IB, the Pr group is converted to a functional group that can react with another W-A-Pr molecule. Step IB can be conducted in various ways, depending on the nature of the W-A-Pr material. As before, any reaction by-products are removed before conducting the next step. In step IC, another W-A-Pr molecule is introduced, which reacts with the polymer chain to extend the polymer chain and again displace a Z moiety and form ZW as a reaction byproduct.

An -(A)$_a$-(B)$_b$-type copolymer can be produced in analogous fashion. After a predetermined number of reaction cycles using the W-A-Pr vapor phase reactant, subsequent cycles are conducted using a reactant of the form W-B-Pr, wherein W and Pr are as defined before. The process can be extended in analogous fashion to form multiblock copolymers having repeating units of two, three, four or more types.

An -(A-B)$_a$-type polymer can be produced in a reaction sequence as follows:

    IIA)

    IIB)

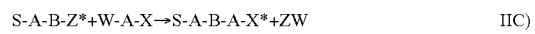    IIC)

wherein steps IIB and IIC are repeated until the desired polymer molecular weight has been attained. In the IIA and IIC reactions, the W chemical functionality (but not the X chemical functionality) reacts with the S-Z* or B-Z* surface species to introduce an A-X group. In the IIB reaction, the Y chemical functionality (but not the Z chemical functionality) reacts with the S-A-X* surface species to deposit B-Z* surface species.

Members of any of the first through fifth classes of monofunctional vapor phase reactants can be used in the reaction sequence IIA-IIC. If either or both of the W-A-X or Y-B-Z reactants used in reaction sequence IIA-IIC is of the fourth or fifth class described above, it will be necessary to introduce one or more intermediate steps to convert the precursor group or a masked or protected functional group, as the case may be, to a reactive functional group.

An -(A-B)$_x$-(E-B)$_y$-type copolymer can be produced in analogous fashion. After a predetermined number of reaction cycles using the W-A-X and Y-B-Z vapor phase reactant, one or more subsequent cycles are conducted substituting a reactant of the form W-E-X for the W-A-X material. Again, the concept can be extended in analogous fashion to produce more complex types of copolymers.

-(A-B-C)$_a$-type polymers can be prepared in accordance with the invention using a three-step reaction cycle that uses three different vapor phase reactants. Such a reaction scheme is illustrated as follows:

    IIIA)

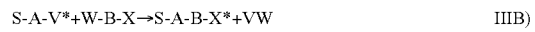    IIIB)

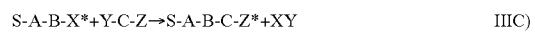    IIIC)

    IIID)

wherein steps IIIB, IIIC and IIID are repeated until the desired polymer molecular weight has been attained. In reactions IIIA-D, Z, T, V, W, X, and Y all represent leaving groups, A, B and C represent repeating units in the polymer chain, S represents an atom or group on the surface of the substrate, and * represents the reactive site. In the IIIA and IIID reactions, the T chemical functionality (but not the V chemical functionality) reacts with the S-Z* or C-Z* surface species to deposit an A-V surface species and extend the polymer chain. In the IIIB reaction, the W chemical functionality (but not the X chemical functionality) reacts with the S-A-V* surface species to deposit a B-X* surface species. In the IIIC reaction, the Y chemical functionality (but not the Z chemical functionality) reacts with the -B-X* surface species to deposit a C-Z surface species. Members of any of the first through fifth classes of reactants can be used in the reaction sequence IIIA-IIID. If any of the T-A-V, W-B-X or Y-C-Z reactants used in reaction sequence IIIA-IIID is of the fourth or fifth class described above, it will be necessary to introduce one or more intermediate steps to convert the precursor group or a masked or protected function group, as the case may be, to a reactive functional group.

In addition to the foregoing, other polymer types are also possible by varying the selection of vapor phase reactants and their order of addition.

Inorganic-Organic Hybrids by ALD.

These fall within two main types. The first type can be viewed as a linear or branched chain structure having metal or semi-metal repeating units which alternate with organic units. The second type can be viewed as being block or multiblock copolymers in which blocks of the inorganic portion of the hybrid are separated by blocks of the organic portion.

In the first type of inorganic-organic hybrid, the repeating units can be schematically represented by the idealized structure:

$$[\text{-M-Z-R-Z}]_n \qquad (IV)$$

wherein M represents a metal or semi-metal atom, each Z is independently a linking group that contains at least one heteroatom, and R represents a hydrocarbyl or inertly substituted hydrocarbyl group. By "inertly substituted", it is meant that the R group contains no substituent which interferes with its ability to form an alternating chain structure with the M atom. In structure IV, n represents the degree of polymerization. n is at least 2, preferably at least 10, and may be at least 25. n can be 100 or more, 500 or more or even 1000 or more. n is most preferably no greater than 50, 40, 30 or 20.

In structure IV, Z is preferably oxygen, sulfur or nitrogen but may also be another linking group, such as carboxylate (—O—C(O)—) or carbonyl, that can form a bond to the M atom. The Z group is preferably bonded covalently to the M atom, rather than ionically. The most preferred Z group is oxygen, as oxygen tends to form the strongest bonds to the M atoms, for most metals and semimetals M.

The M atom can be one or more of a wide range of metals and semimetals. The metal or semimetal should be polyvalent, capable of forming one or more compounds that can be used as precursors in the ALD process, and should form strong covalent bonds with oxygen, nitrogen or sulfur, preferably oxygen. The metal preferably forms halides and/or forms compounds with alkyl groups (to form metal alkyls), alkenes or dienes, which can be volatilized under some conditions of temperature and pressure at which the compounds are thermally stable. Many metals within IUPAC groups 2-12 are suitable, as are group 13-15 metals and semimetals such as boron, silicon, gallium, indium, germanium, tin, lead, antimony or bismuth. Examples of suitable metals include IUPAC group 2 metals such as magnesium, calcium, strontium and barium, IUPAC group 4 metals such as titanium and zirconium, IUPAC group 7 metals such as manganese, IUPAC group 8-10 transition metals (iron, nickel, cobalt and the like), IUPAC group 12 metals such as zinc and cadmium, IUPAC group 13 metals and semimetals such as aluminum, gallium and indium, IUPAC group 14 metals or semimetals such as silicon, tin and lead, as well as antimony and bismuth. Zinc and aluminum are especially preferred.

The R group is a divalent or polyvalent hydrocarbyl group or substituted hydrocarbyl group. A substituted hydrocarbyl group may contain ether, ester, carbonate, urethane, or other linking groups. It may be substituted with inert substituents such as halogen, nitro, —SO$_2$— and other groups. If the R group is polyvalent, it will be bonded to 3 or more Z groups which, in turn, will be bonded to 3 or more M atoms, in which case the R group will represent a branch point in the polymer structure. It is not necessary that each R group be the same. For example, a mixture of divalent and trivalent R groups may be used if desired. This provides a mechanism for controlling the level of branching in the polymer.

The R group is small enough that the vapor phase reactant which gives rise to the —Z—R—Z— groups can be volatilized at a temperature at which it does not degrade. The R group typically will contain no more than 20 carbon atoms, more preferably no more than 15 carbon atoms and more preferably no more than 10 carbon atoms.

Structure IV is idealized and simplified, being intended to illustrate the alternating and repeating arrangement of metal and organic groups in the inorganic/organic polymer. Structure IV omits other substituents that may be present (particularly those bonded to the metal or semimetal atoms), and does not indicate branching or crosslinking points which may be included within the polymer structure. For example, the M atom may be bonded to other substituents, including any substituents Y as may have been present on the starting material. M may be bonded to one or more oxygen atoms which may also be bonded to other M atoms, as needed to fulfill valence requirements for the particular metal M. Note also that in some cases the M atom can be bound to three or more —Z—R—Z— groups, in which case the M atoms represent a branching point in the polymer structure. In some cases, one or more X groups from the starting material may remain bonded to the M atoms. It is also possible that at least some of the M atoms may be divalently bonded to a —Z—R—Z— group to form a cyclic structure.

Hybrid inorganic/organic polymers of particular interest are have chain structures in which a metal or semimetal atom alternates with —O—R—O—, groups, wherein R is $C_2$-$C_6$ alkylene, —$C_mH_{2m}$—(O—$C_mH_{2m}$)$_r$—, where m is from 2 to 6 and r is from 1 to 10, preferably 1 to 3, phenylene or

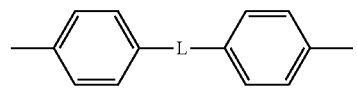

where L is —S—, —S—S—, —SO—, —SO$_2$, —O—CO—O—, —CO— or —O— or a divalent hydrocarbon group suitably having from 1 to about 10, preferably from 1 to about 5, more preferably from 1 to about 3 carbon atoms. The metal M in these polymers of particular interest is an IUPAC group 2 metal such as magnesium, calcium, strontium and barium, an IUPAC group 4 metal such as titanium and zirconium, and IUPAC group 7 metal such as manganese, an IUPAC group 8-10 transition metal (iron, nickel, cobalt and the like), an IUPAC group 12 metal such as zinc and cadmium, an IUPAC group 13 metal or semimetal such as boron, aluminum, gallium and indium, an IUPAC group 14 metal or semimetal such as silicon, tin, lead, antimony or bismuth. As before, zinc and aluminum are especially preferred.

The second type of inorganic-organic hybrid can be described as a block or multiblock copolymer in which blocks of the inorganic material are separated by blocks of the organic polymer. These are formed by depositing multiple layers of the inorganic layer via repeated ALD cycles followed by depositing multiple layers of the organic material via repeated ALD cycles. Additional inorganic and organic layers are deposited until the desired number of layers is obtained. The thickness of the individual layers and the total film thickness are therefore controllable in the ALD process.

Organic reactants as described above can be used in conjunction with traditional ALD reactants to form inorganic-organic nanocomposites. Examples of such traditional ALD reactants include compounds such as trimethylaluminum (to form $Al_2O_3$), hafnium tetrachloride (to form $HfO_2$), silicon tetrachloride (to form $SiO_2$), titanium tetrachloride (to form $TiO_2$), diethyl zinc (to form ZnO), tetra(dimethylamino)zirconium (to form $ZrO_2$), and the like. The organic reactant must be capable of reacting with a functional group on the surface of the inorganic layer, and also must provide (directly or indirectly) a functional group with which the inorganic reactant can react and form a covalent bond on the surface of the organic layer.

One specific organic-inorganic composite of this type is produced by depositing alternate layers of an ABC polymer and alumina. This ABC polymer layer is prepared using trimethylaluminum (TMA, $Al(CH_3)_3$), ethanolamine (EA, HO—$CH_2CH_2$—$NH_2$) and maleic anhydride (MA, $C_4H_2O_3$). After depositing a layer of the ABC polymer, an alumina layers are deposited using sequential exposures of trimethylaluminum (TMA) and $H_2O$. After the alumina layer is deposited, another layer of the ABC polymer and be further deposited. Another layer of alumina can then be further deposited if desired to form an ABC polymer/$Al_2O_3$ multilayer.

Pore Formation.

The pores may be formed via a variety of possible mechanisms, including chemical processes such as oxidization, reduction, hydrolysis, pyrolysis, decomposition or some other chemical reaction or mechanism.

Pores are most preferably formed in an organic polymer by a carbonization process. In the carbonization process, the polymer is subjected to elevated temperatures, typically in the absence of oxygen or an oxidizing atmosphere, sufficient to remove most or all of the hydrogen and other heteroatoms from the polymer. This process forms a carbonized layer. Such carbonization processes are well known and are used—for example, to produce carbon fiber from polymers such as polyacrylonitrile. Preferred organic polymer films that can be carbonized in this manner include various polyamides, including, for example, nylon 66 and poly(p-phenylene terephthalamide).

Pores in inorganic-organic hybrids can be formed in various ways. Preferred inorganic-organic hybrids that include —O-M-O-linkages (wherein M is a metal or semi-metal such as Si, Al or Ti) can be oxidized or reduced to produce pores. Oxidation can be performed by heating the film in the presence of air or oxygen at a temperature of at least 400° C. This is believed to burn out the organic portion of the molecule. Such hybrids also can be oxidized by contact with water at room temperature for a period of hours or days, or at some higher temperature for a shorter period. This procedure is believed to hydrolyze the hybrid and remove the organic portion of the film. The removal of all or a portion of the organic portion of the film is believed to result in the formation of pores in the film.

The process of this invention permits control over both the thickness of the film, and the porosity of the film. Film thickness is controlled directly by the number of ALD reaction cycles that are performed when the film is laid down. Porosity is controlled by (1) the choice of pore formation method, (2) the conditions, including treatment time, under which the pore formation step is performed and, in the case of certain inorganic-organic hybrid films, the relative amounts of the inorganic and organic portions of the film. A particularly useful method of controlling porosity is by controlling exposure times to conditions which promote pore formation.

The resulting porous film can perform various functions, depending on the particular substrate and the particular end-use application. In some cases, the porous film can block or limit access to the underlying substrate.

Thus, for example, in some cases, the size and/or number of pores can limit the rate at which a material can permeate through the film to reach the underlying substrate, or, conversely, limit the rate at which the underlying substrate can permeate through the film. If the substrate is a pharmaceutical compound or a nutrient, for example, the film can act as a sustained or delayed release coating. The size and number of pores, together with the thickness of the film, can limit the rate at which the substrate is released into a patient or consumer. Sustained and/or delayed release fertilizers can be produced in an analogous way. In other chemical processes, the pores can allow a slowed or delayed release of an active substrate material to control, for example, the rate or extent of a chemical reaction.

In other cases, the film can perform a selectivity function, permitting certain substances to permeate through to the underlying substrate while excluding others. Thus, if the substrate is a catalytic material, the porous substrate can exclude certain materials from permeating through the film and reaching active catalytic sites on the surface of the substrate, while allowing other materials to reach those sites and engage in a desired chemical reaction. Therefore, in certain embodiments, the invention provides a diffusion-limited catalyst that includes a metal catalyst which is supported by a substrate. The supported catalyst is coated with a porous film as defined herein, which can function to increase selectivity of a chemical process conducted in the presence of the supported catalyst to the desired reaction. The porous coating is preferably from 1 to 10 nm thick in such embodiments. It is believed to perform as a diffusion barrier that allows the desired reagent(s) to reach the active metals catalyst surface, while inhibiting or preventing larger molecules (including potential catalyst poisons) from contacting the catalyst. This catalyst may also promote selectivity by permitting reactants of specific shapes to make contact with the catalyst surface, while excluding molecules of other shapes. Selectivity is also believed to be enhanced due to the creation of a conformal coating over all catalyst surfaces. Excellent reaction rates can also be achieved due to the thinness of the film; reactant molecules only need to diffuse through a sub-nanometer pore for a distance of several nanometers to reach the catalyst surface. By contrast, reactants often have to diffuse through distances on the order of microns to reach an active catalyst site on a zeolite catalyst. Furthermore, the coating thickness can also be controlled precisely via the ALD and/or MLD process, and the coating thickness can become a parameter that can be used to tune catalyst selectivity and activity. Still further control over the performance of the catalyst can be obtained through control of the structure of the applied film and the pore-forming conditions.

The presence of a porous oxide layer on a supported metal catalyst in accordance with the invention can have the benefit of dramatically reducing the rate of catalyst sintering, particularly when the pore size is less than 5 nm. Most supported metal catalysts consist of small metal particles dispersed on high surface area porous oxides, and tend to deactivate due to reduction in metal surface area as the small metal particles grow together or metal atoms move from one metal particle to another. This sintering occurs more rapidly at higher temperatures. Sub-nanometer pores can also enhance selectivity and poisoning resistance.

If the substrate is a MEMS device, such as an MIS sensor, the porous film can permit certain analytes of interest to approach the sensor surface, while excluding other molecules, and thus enhance the selectivity of the sensor.

A porous film in accordance with the invention also can form as a membrane in water desalination, gas separation, and selective proton/oxygen conduction in fuel cells or other applications, allowing certain materials to pass through (generally based on molecular size but possible based on other characteristics such as affinity for the film), while excluding other materials.

The following examples are provided to illustrate the invention, but are not intended to limit the scope thereof.

EXAMPLE 1

Alucone ALD on Silica Nanoparticles 250 nm spherical silica particles (Sigma Aldrich) are coated with different thicknesses of aluminum alkoxide (alucone) via an ALD process in a vibrating fluidized bed reactor. The reactants are trimethylaluminum (TMA) and ethylene glycol (EG). The fluidized bed is 3.5 cm in diameter. There is a 10 μm pore size porous metal disc in the middle of the reactor as the gas distributor. The reactor is encased by a clamshell-type furnace and bolted to a platform that rests on four large springs. The reactor is maintained at low pressure by a vacuum pump, and the dosing header can also be pumped down directly using a smaller separate pump. A vibration system is used to overcome some of the interparticle forces and improve the quality of fluidization. High purity $N_2$ gas is used as the purge gas to remove the unreacted precursor and any byproducts formed during the reaction. Its flow rate is controlled by a mass flow controller (MKS Instruments). Baratron® capacitance manometers (MKS Instruments) are located below the distributor plate and at the outlet of the reactor column to measure the pressure drop across the bed of the particles. All valves used to provide the transient dosing are automatically controlled through LabView software (National Instruments). Pressure measurements are recorded to monitor the progress of each dosing cycle. A mass spectrometer (Stanford Research Systems) is connected to the reactor and to track the reaction and optimize the dose time of precursors.

10 g of 250 nm spherical silica particles are loaded into the reactor. The reaction temperature is 100° C. The feeding lines are kept at 80-100° C. to avoid excessive adsorption of EG on the internal walls of the system that could promote CVD side-reactions. The minimum pressure inside the reactor is ~50 mTorr and the minimum fluidization superficial gas velocity is 0.5 cm/s determined by measuring the pressure drop across the bed versus the $N_2$ superficial gas velocity. During the MLD reaction, TMA is fed through the distributor of the reactor using the driving force of its room-temperature vapor pressure, and the flow rate of TMA is adjusted using a needle valve to ensure that the TMA vapor pressure is high enough for particle fluidization. The vapor pressure of EG is very low at room temperature; therefore, the EG bottle is heated at 80-120° C. The flow rate control offered by the needle valve is then insufficient to prevent the pure-component EG vapor stream from flooding into the system. Since EG is a sticky molecule, it can be very difficult to remove any overdosed vapor from the particle surfaces or the reactor walls. A bubbler is employed to dilute the heated EG vapor stream and allow for vapor delivery to the reactor in a controllable fashion and prevented the overdose of the precursor. The bubbler inlet is controlled using a mass flow controller to allow a calibrated amount of $N_2$ to be bubbled through the precursor reservoir. In this case, a flow rate of 4 sccm of $N_2$ is sufficient to deliver EG to the reactor. Before the reaction, the particles are dried at 120° C. under a continuous $N_2$ flow for 3 hr. A typical coating cycle occurs with the following sequence: TMA dose, $N_2$ purge, evacuation; EG dose, $N_2$ purge, evacuation. In this manner, there is no overlap between the two reactants, and no CVD side-reactions could occur.

Figure 2:
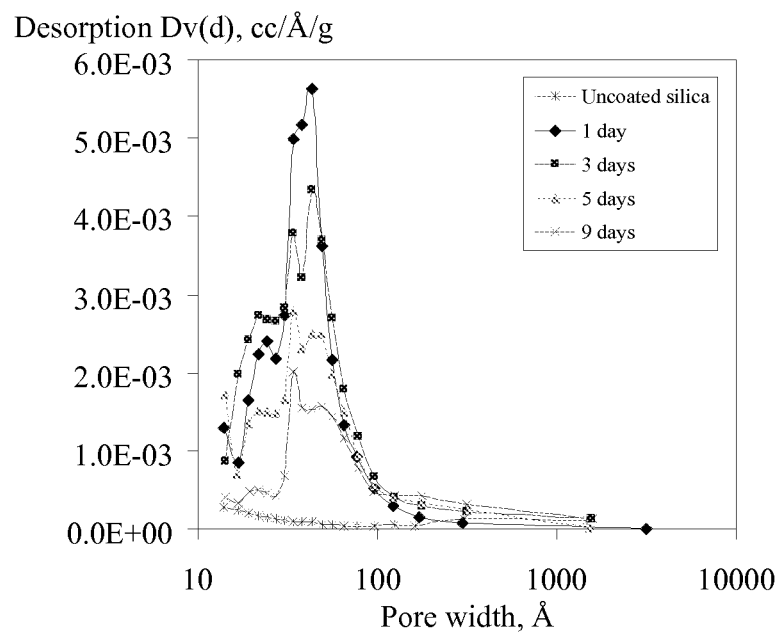
FIG. 2 is a graph indicating the distribution of mesopores on a water-treated alucone film produced according to Example 1, as a function of treatment time.

$SiO_2$ particles coated with 25 nm alucone. ALP films produced as described above are soaked in deionized $H_2O$ at room temperature for 1, 3, 5, 7 and 9 days, respectively. In the test, for every sample, 0.5 g of particles is put in a 30 mL vial and soaked in 5 mL deionized $H_2O$. After given times, particles are filtered and vacuum dried. The dried particles are characterized by 196° C. nitrogen adsorption and desorption isotherms for surface area and pore size distribution analysis. The pore size distributions of micropores (less than 10 nm) and mesopores (10-500 nm) are calculated by HK model and BJH model, respectively. FIGS. 1 and 2 show the pore size distributions of smaller and larger pores.

The specific surface areas (SSA) are calculated by the BET method. The surface area of the uncoated silica particles is 25.92 $m^2/g$, and that of the alucone-coated particles (prior to pore formation) is 18.28 $m^2/g$. Upon soaking, the surface areas peak at 143.49 $m^2/g$ after 1-3 days of soaking. The surface area then diminishes to about 85 $m^2/g$ over 9 days of soaking. The much higher surface area of the soaked samples compared to the starting material and the alucone-coated particles is attributed to the formation of porosity in the alucone films during the water-immersion step. The loss of porosity over the last several days of soaking is attributed to the physical breakage of the aluminum-containing network that remains after the ethylene glycol portion of the alucone is removed by hydrolysis, due to the formation of bubbles.

A Theta Gravitronic II thermogravimetric analyzer (TGA) is used to study the oxidation of the alucone MLD films in air. A sample of an alucone-coated silica particle prepared as described above is loaded into an alumina crucible, suspended from a microbalance by a Pt wire, and heated in a tube furnace from room temperature to 400° C. at a rate of 1° C./min. An air stream is allowed to flow downward across the crucible at 200 sccm to promote the oxidation of the hybrid polymer films. The change in mass is followed as a function of time at 400° C. the mass decreases steadily during the temperature ramp up and during the hour at 400° C., indicating that the organic portion of the alucone polymer is lost during those steps.

During the TGA oxidation process, all carbon and hydrogen in the polymer is burned out and aluminum will be converted to alumina. Since the MLD film itself contains enough oxygen atoms, no additional oxygen molecules are needed to convert Al to alumina. Therefore, the total mass of the films is equal to the mass loss during the TGA test (the substrate mass remains unchanged) plus the mass of alumina left on the particle surface, which can be calculated based on inductively coupled plasma atomic emission spectroscopy (ICP-AES) Al concentration on particles. Combined with the mass loss of the alucone coated $SiO_2$ particles in TGA test and the mass concentration of aluminum in the alucone coated $SiO_2$ particles by ICP-AES, the concentration of porous alumina films is calculated to be ~13.2 wt. %.

Since there is only ~25 nm of alucone film on the ~250 nm dense $SiO_2$ particle surface, and the concentration of porous alumina films on whole particles is ~13.2 wt. %, the surface area of the porous film itself should be higher. For example, for a porous film formed by oxidation in air at 400° C., the surface area of the particles is 191.63 $m^2/g$, and the surface area of the porous film itself is ~1452 $m^2/g$. Similarly, the surface area of the samples oxidized at 1000° C. is 70.19 $m^2/g$, and the surface area of the porous film itself is ~532 $m^2/g$.

Figure 3:
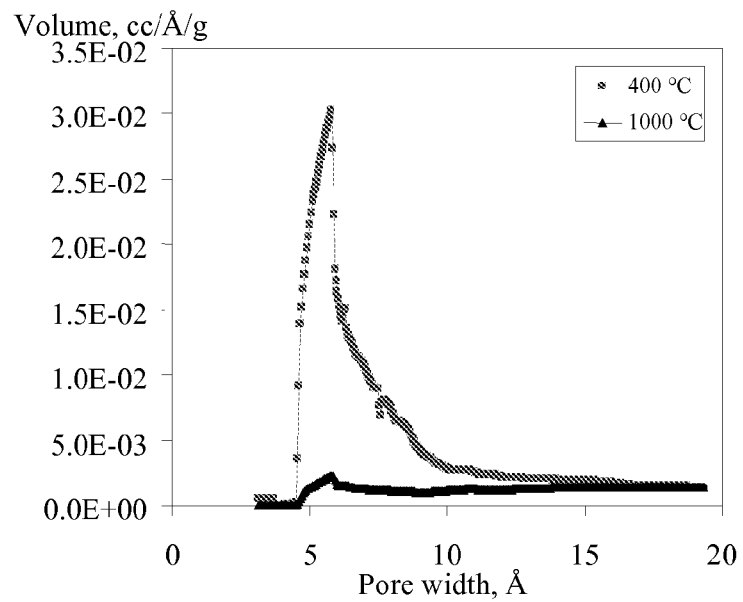
FIG. 3 is a graph indicating the distribution of micropores on an air-oxidized alucone film produced according to Example 1, as a function of oxidation temperature.
Figure 4:
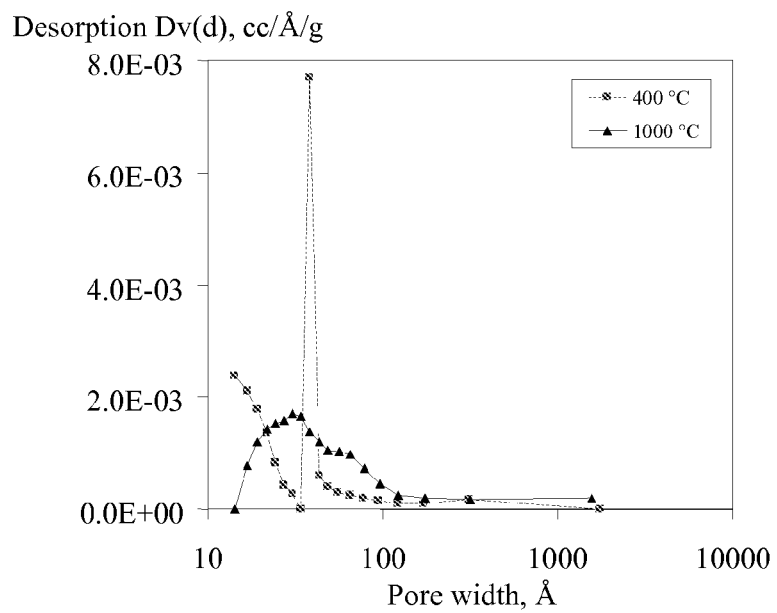
FIG. 4 is a graph indicating the distribution of mesopores on an air-oxidized alucone film produced according to Example 1, as a function of oxidation temperature.

FIGS. 3 and 4 show the pore size distributions of the samples oxidized at different temperatures in air. More of the smaller pores are formed at 400° C. The pore diameter of alumina is estimated to be ~0.6 nm with narrow distribution estimated by the method. Pores with the diameter of ~3.8 nm estimated by BJH method are also observed. More of these larger pores are formed at 1000° C. The lower surface area and fewer smaller pores formed at 1000° C. indicate that the alumina network breaks to form larger pores during the release of organic groups at higher temperatures.

EXAMPLE 2

Nanocoating Titania Nanoparticles with Alucone Films

The deposition of alucone films on 160 nm pigment-grade anatase titania particles (Millennium Chemicals) is carried out in a similar fashion to the deposition of alucone films as described in Example 1. The reactor configuration conditions are all identical to those described above. The minimum fluidization superficial gas velocity is 0.5 cm/s. 10 g of titania particles are loaded into the reactor. The reaction temperatures are in the range of 80-160° C. EG is delivered to the reactor using a bubbler, and the flow rate of carrier gas $N_2$ is 4 sccm. Before the reaction, the particles are dried at 120° C. under a continuous $N_2$ flow for 3 hr. Transmission electron microscopy (TEM) images of the titania particles coated with 10 cycles at 80-160° C. showed an extremely conformal alucone films. The thickness of the film is ~7 nm, which represents a growth rate of ~0.35 nm/cycle at 160° C. The film thickness of the titania particles coated with 20 cycles at 100° C. is ~10 nm, which represented a growth rate of ~0.50 nm/cycle at 100° C.

$TiO_2$ particles with various thicknesses of alucone films, prepared as described above, are soaked in deionized $H_2O$ at room temperature. In the test, for every sample, 0.5 g of MLD coated particles is put in a 30 mL vial and soaked in 5 mL deionized $H_2O$. After given times, particles are filtered and vacuum dried. Both the aluminum concentration in the filtrate and the aluminum concentration on the particles are measured. Several drops of nitric acid are added to the filtrate to make sure that the aluminum is not precipitating out of the samples, and the aluminum concentration in the filtrate is directly measured by TCP-AES using an Applied Research Laboratories ICP-AES 3410+. The filtered particles are dried, digested with NaOH solution for 24 hr at 95° C., and then measured by ICP-AES.

$TiO_2$ particles with 20 cycles of an alucone coating deposited at 100° C. are put into vials containing deionized water at room temperature and allowed to digest for different periods of time. The Al concentration in water remains less than about 300 ppm, indicating that the aluminum does not leave the particle surfaces in significant amounts upon exposure to moisture. Further testing is done by soaking $TiO_2$ particles having different thicknesses of alucone films in deionized $H_2O$ at room temperature for one week.

EXAMPLE 3

Photoactivity Passivation of Pigment-Grade $TiO_2$ Particles

Pigment-grade $TiO_2$ particles (160 nm anatase, from Millennium Chemicals) are coated with different thickness of alucone films fabricated by MLD at 100° C., as described in Example 2. Methylene Blue ($C_{16}H_{18}N_3ClS$, MB) is the probe molecule in this study for evaluating the passivation effect of the photocatalytic performance of the alucone films. For a typical test, 0.1 g of sample particles are dispersed in 100 mL MB aqueous solution with a concentration of 10 ppm. The solution is kept in the dark under stirring to measure the adsorption of MB into each sample. After keeping at least 60 min, MB concentration in the solution is found to be constant on all samples prepared. For UV irradiation, one UV lamp (Mineralogical Research Co., CA) of 100 W is used at the distance of about 10 cm from the solution. Strength of UV light with a wavelength of 360 nm at the position of the solution surface is measured to be ~10 $mW/cm^2$ by an IL1400A Radiometer/Photometer, International Light. The solution is continuously stirred during UV irradiation. Concentration of MB in the solution is measured as a function of irradiation time of UV rays. At the given time intervals, analytical samples are taken from the suspension and passed through 0.2 μm Millipore filter to remove the particles before analysis. The determination of MB concentration (concentration-dependent absorbance) is carried out on 2 mL of solution, which is sampled from absorbance change at the wavelength of 664 nm with a Perkin Elmer UV/VIS/NIR spectrometer Lambda 35.

For the uncoated $TiO_2$ particles, the relative concentration of MB in the solution has an exponential relation with the irradiation time, and the $C/C_0$ is almost zero after 90 min. In contrast, the alucone coated titania particles show mitigated photoactivity. For example, for the particles of alucone coating with 2 cycles (~1 nm thick), with 5 cycles (~2.5 nm thick), and with 10 cycles (~5 nm thick), $C/C_0$ is 0.42, 0.68, and 0.80 after 190 min of UV radiation, respectively. For the particles with 20 cycles (~10 nm thick) of alucone coating, no measurable activity over the same length of time is observed. These results demonstrate that the alucone coatings prevent photocatalytic activity on the surface of titania nanoparticles; no macro-sized pores are formed in 190 min of irradiation, otherwise, MB molecules would diffuse through the coatings and the photocatalytic performance of $TiO_2$ particles would be detected.

For comparison, alucone-coated titania particles are aged in deionized $H_2O$ for one week and dried, and are evaluated for a passivation effect of the photocatalytic performance. The $C/C_0$ for uncoated particles again is almost zero after 90 min. In contrast, the titania particles with aged alucone films show mitigated photoactivity, but not as efficient as those alucone films that did not undergo the aging process; also, there are lag times for the photocatalytic performance of the particles with different thicknesses of coatings. For the particles with 15 cycles of alucone coatings, $C/C_0$ is 0.24 after 190 min of UV radiation; and for the particles with 20 cycles of alucone coatings, $C/C_0$ is 0.35 after 190 min of UV radiation. The lag times for the photocatalytic performance increases with the increase of MLD coating cycles (film thickness), and the lag time for particles with 20 cycles of MLD coating is as long as 20 min.

These results indicate that the alucone films degrade in $H_2O$ to form porous films.

EXAMPLE 4

Alucone MLD on Tubular α-Alumina Supports (5 nm Pores)

Tubular α-alumina supports (5 nm pores, Pall Corp.) are 6 cm in length and 1 cm in diameter (outside). The deposition of alucone MLD films on the tubular supports is carried out in a similar fashion as described in Example 1, but the tubular supports are suspended in the middle of the reactor tube, and no fluidization and vibration are needed. The reaction temperature is 160° C. EG is delivered to the reactor using a bubbler, and the flow rate of carrier gas $N_2$ is 4 sccm. Before the reaction, the supports are dried at 120° C. under a continuous $N_2$ flow for 3 hr. With 100-200 cycles of alucone MLD coatings, no gas permeability ($<4.3\times10^{-11}$ mol/m²/s/Pa of nitrogen) is measured for tubular alumina supports, which means that the as-applied alucone MLD films are dense and can seal the nanosized pores on the tubular alumina support.

The MLD treated tubular alumina support is then put in an atmosphere of water vapor for different times and the gas permeability is measured. After one hour treatment time, and after 20 hours treatment time, the films have negligible permeability to hydrogen, nitrogen and carbon dioxide. However, after 100 hours treatment time, the films exhibit a permeance to hydrogen of $6\times10^{-7}$ mol/m²/s/Pa, a permeance to nitrogen of about $1.7\times10^{-7}$ mol/m²/s/Pa, and a permeance of about $1.3\times10^{-7}$ mol/m²/s/Pa. The increasing permeance of the films with increasing treatment time indicates that pores form in the alucone film when exposed to water vapor. The ideal selectivities of permeance for these light gases indicate the Knudsen diffusion. This phenomenon means most of the pores formed are larger pores, which dominate the gas diffusion.

EXAMPLE 5

A fluidized bed reactor is used to deposit platinum nanoparticles onto high surface area silica gel particles. The size of the silica gel particles is 30-75 μm, their pore size is 15 nm, and their surface area is 240 m²/g. Methylcyclopentadienyl-(trimethyl) platinum(IV) ($MeCpPtMe_3$) and oxygen are used as precursors. The reaction temperature is 320° C. 5 grams of silica gel particles are loaded into the reactor. Before the reaction, the particles are degassed at 320° C. for about 5 hours. A nitrogen stream with a flow rate of 5 sccm is then fed as the carrier gas for platinum precursor bubbler and as the purge gas to help remove unreacted precursor and any by-products formed during the reaction. The system is pumped down to 50 mTorr after each dose of reactant and prior to the dose of the next precursor. Five reaction cycles are completed.

Analysis of the silica gel particles at this stage shows that they contain about 2.5% by weight platinum, in the form of 2 nm particles which are distributed throughout the gel particles.

An alucone film is then deposited onto the platinum-containing silica gel particles via the MLD process described before, using a vibrating fluidized bed reactor. The reactants are trimethylaluminum (TMA) and ethylene glycol (EG). 5 g of the platinum-containing silica gel particles are coated. Before the reaction, the particles are dried at 120° C. under a continuous $N_2$ flow for 3 hours. The reaction temperature is 160° C. The minimum pressure inside the reactor is about 50 mTorr and the minimum fluidization superficial gas velocity was 0.5 cm/s (about 5 sccm). A stream of nitrogen at a flow rate of 4 sccm is used to deliver EG to the reactor. The reaction cycle includes the following sequence: TMA dose, $N_2$ purge, evacuation; EG dose, $N_2$ purge, evacuation. Multiple samples are coated with 10, 20, 30 and 40 cycles of the alucone coating. After coating, the samples contain concentrations of platinum and aluminum as indicated in the following

| Ex. No. | MLD coating cycles | Pt, wt. % | Al, wt. % |
|---|---|---|---|
| 5-A | 10 | 2.00 | 6.34 |
| 5-B | 20 | 1.95 | 6.82 |
| 5-C | 30 | 1.86 | 7.88 |
| 5-D | 40 | 1.76 | 9.77 |

The alucone films are converted to porous aluminum oxide films by oxidation in air. A Theta Gravitronic II thermogravimetric analyzer (TGA) is used to follow the oxidation. In each case, the alucone-coated, platinum-containing silica gel particles are loaded into an alumina crucible, suspended from a microbalance by a Pt wire, and heated in a tube furnace from room temperature to 400° C. at a rate of 1° C./min. The samples are maintained at 400° C. for 1 hour, and then cooled down to room temperature at a rate of 1° C./min. An air stream is allowed to flow downward across the crucible at 200 sccm during the heating and cooling regimen to promote the oxidation of the hybrid polymer films. The samples lose mass on the upheat step, but almost no further mass change is observed after maintaining temperature at 400° C. for 1 hour. The loss of mass indicates that the organic portion of the alucone polymer is being lost to leave behind a porous alumina coating.

The amount of mass that is lost, the platinum content of the resulting particles, and the active platinum surface area are measured.

Based on the $H_2$ chemisorption, the average particle size of platinum nanoparticles is 1.7 nm in the silica gel particles that did not have an applied alucone coating. The metal dispersion in this case is 65.0%, and the active surface area is 3.79 m²/g. For the MLD coated particles with a porous film made by applying 10 cycles of alucone and then oxidizing the applied alucone (Ex. 5-A), the metal dispersion decreases to 42.0% and the active surface area decreases to 2.31 m²/g; with 20 cycles of alucone MLD (Example 5-B), the metal dispersion further decreases to 36.9% and the active surface area decreases to 1.99 m²/g. The values for the particles coated with 30 and 40 alucone cycles (Ex. 5-C and 5-D, respectively) are very similar to those of Example 5-B.

Examples 5-A-5-D, containing porous alumina films, are evaluated for thermal stability by heating duplicate samples to 400° C., 600° C. and 800° C. for four hours in air. The platinum dispersion % and active surface area are measured by $H_2$ chemisorption. Results are as given in the following table.

| Ex. | MLD coating cycles | Pt wt. % | Treatment temperature, ° C. | Pt dispersion, % | Active surface area, m²/g |
|---|---|---|---|---|---|
| * | 0 | 2.50 | / | 65.0 | 3.79 |
| * | 0 | 2.50 | 400 | 59.2 | 3.66 |
| * | 0 | 2.50 | 600 | 11.9 | 0.737 |

-continued

| Ex. | MLD coating cycles | Pt wt. % | Treatment temperature, °C | Pt dispersion, % | Active surface area, m²/g |
|---|---|---|---|---|---|
| * | 0 | 2.50 | 800 | 3.91 | 0.242 |
| 5-A | 10 | 2.23 | / | 42.0 | 2.31 |
| 5-A | 10 | 2.23 | 400 | 42.0 | 2.31 |
| 5-A | 10 | 2.23 | 600 | 37.3 | 2.06 |
| 5-A | 10 | 2.23 | 800 | 10.3 | 0.569 |
| 5-B | 20 | 2.19 | / | 36.9 | 1.99 |
| 5-B | 20 | 2.19 | 400 | 47.9 | 2.59 |
| 5-B | 20 | 2.19 | 600 | 41.5 | 2.25 |
| 5-B | 20 | 2.19 | 800 | 26.8 | 1.45 |
| 5-C | 30 | 2.12 | / | 37.5 | 1.96 |
| 5-C | 30 | 2.12 | 400 | 42.8 | 2.24 |
| 5-C | 30 | 2.12 | 600 | 38.9 | 2.04 |
| 5-C | 30 | 2.12 | 800 | 25.4 | 1.33 |
| 5-D | 40 | 2.03 | / | 37.7 | 1.89 |
| 5-D | 40 | 2.03 | 400 | 42.3 | 2.12 |
| 5-D | 40 | 2.03 | 600 | 42.8 | 2.14 |
| 5-D | 40 | 2.03 | 800 | 34.0 | 1.71 |

* Comparative with platinum particles but no applied alumina porous film.

For the comparative sample with no porous film coating, both the platinum dispersion and active surface area decrease drastically with increasing heat treatment temperature. For Example 5-A, there is no change of Pt dispersion or active surface area with the samples that are heated at 400° C., and somewhat more loss of platinum dispersion and active surface area after treatment at 600° C. and a large loss of those values after heating at 800° C. These results indicate that porous alumina films help stabilize the platinum nanoparticles. The thicker porous alumina films further stabilize the platinum nanoparticles. Example 5-D exhibits no reduction of Pt dispersion or reactive surface area after the sample was heated at 600° C. for four hours. Even after heat treatment at 800° C. for the Pt dispersion is still as high as 34.0%, and the active surface area is as high as 1.71 m²/g.

What is claimed is:

1. A process for producing a porous film on a substrate, comprising (a) applying a 0.5 to 50 nm-thick film of an alucone, zinc-ethylene glycol hybrid polymer, or titanium-ethylene glycol hybrid polymer to at least a portion of the surface of a substrate via an atomic layer deposition process, and (b) forming pores in the hybrid film by oxidizing the hybrid film by heating the film in the presence of air or oxygen at a temperature of at least 400° C. to burn out the organic portion of the alucone, zinc-ethylene glycol hybrid polymer, or titanium-ethylene glycol hybrid polymer or by contacting the film with water to hydrolyze the alucone, zinc-ethylene glycol hybrid polymer, or titanium-ethylene glycol hybrid polymer and remove the organic portion of the film.

2. The process of claim 1, wherein the porous film has a thickness of at least 2 nm.

3. The process of claim 2, wherein the porous film has a thickness of up to 30 nm.

4. The process of claim 3, wherein the porous film has a surface area of at least 10 m²/g.

5. The process of claim 4, wherein the porous film has a surface area of at least 100 m²/g.

6. The process of claim 5, wherein the porous film has pores in the size range of from 2 to 100 angstroms.

7. The process of claim 6, wherein the porous film is free of pores having widths greater than 1000 angstroms.

8. The process of claim 7 wherein the substrate material is or contains catalytic material; a reagent for a chemical reaction; a porous support for a membrane or filtration device; a pharmaceutical or nutrient; or a MEMS device or sensor.

* * * * *